United States Patent

Sugawara et al.

[11] Patent Number: 6,060,772
[45] Date of Patent: May 9, 2000

[54] POWER SEMICONDUCTOR MODULE WITH A PLURALITY OF SEMICONDUCTOR CHIPS

[75] Inventors: Hidekazu Sugawara, Yokohama; Tetsujiro Tsunoda, Urawa; Satoshi Nakao, Tokyo, all of Japan

[73] Assignee: Kabushiki Kaisha Toshiba, Kawasaki, Japan

[21] Appl. No.: 09/106,351

[22] Filed: Jun. 29, 1998

[30] Foreign Application Priority Data

Jun. 30, 1997 [JP] Japan .................................. 9-174505

[51] Int. Cl.[7] .......................... H01L 23/02; H01L 23/48; H01L 23/52
[52] U.S. Cl. .......................... 257/678; 257/691; 257/722; 257/723
[58] Field of Search ..................... 257/678, 722, 257/691, 723

[56] References Cited

U.S. PATENT DOCUMENTS

| | | | |
|---|---|---|---|
| 5,291,065 | 3/1994 | Arai et al. .............................. | 257/723 |
| 5,444,297 | 8/1995 | Oshima et al. ......................... | 257/691 |
| 5,466,969 | 11/1995 | Tsunoda ................................. | 257/706 |
| 5,488,256 | 1/1996 | Tsunoda . | |
| 5,497,291 | 3/1996 | Hosen ..................................... | 361/804 |
| 5,519,252 | 5/1996 | Soyano et al. ......................... | 257/690 |
| 5,521,437 | 5/1996 | Oshima et al. ......................... | 257/701 |
| 5,616,955 | 4/1997 | Yamada et al. ......................... | 257/690 |
| 5,621,243 | 4/1997 | Baba et al. ............................. | 257/712 |
| 5,920,119 | 7/1999 | Tamba et al. .......................... | 257/718 |
| 5,942,797 | 8/1999 | Terasawa ................................ | 257/723 |

FOREIGN PATENT DOCUMENTS 61-136252  6/1986  Japan ..................... 257/678

*Primary Examiner*—Mahshid Saadat
*Assistant Examiner*—Jhihan B. Clark
*Attorney, Agent, or Firm*—Oblon, Spivak, McClelland, Maier & Neustadt, P.C.

[57] ABSTRACT

On a metal base, an insulated wiring substrate is fixed, and, on a conductive layer on the insulated wiring substrate, semiconductor chips are disposed. Above the semiconductor chips, a controlling substrate is provided, and the signals produced in this controlling substrate are supplied to electrodes on the surfaces of the semiconductor chips via bonding wires passing through openings provided in the controlling substrate.

21 Claims, 4 Drawing Sheets

POWER SEMICONDUCTOR MODULE WITH A PLURALITY OF SEMICONDUCTOR CHIPS

BACKGROUND OF THE INVENTION

The present invention relates to a power semiconductor module constituted in such a manner that a plurality of semiconductor chips and a control circuit for controlling the plurality of semiconductor chips are housed in the same case.

FIG. 1 shows the structure of a conventional power semiconductor module, wherein the reference numeral 1 denotes a metal base, and numeral 2 and 2 denote insulated wiring substrates, respectively. The insulated wiring substrates 2 are each formed in such a manner that, on the front and back surfaces of a ceramics substrate, conductive layers composed of a metal such as, e.g. Cu are formed. The insulated wiring substrates 2 are each is fixed onto the metal base 1 by soldering the conductive layer formed on the back surface thereof. On the conductive layer formed on the front surface of each of the insulated wiring substrates 2, a plurality of semiconductor chips 3 are fixed by soldering, respectively.

The metal base 1 is fixed to a resin case 4, and electrode pads on the semiconductor chips 3 and the conductive layers on the front surfaces of the respective insulated wiring substrate 2 are connected to electrodes 5 provided on the resin case 4 through bonding wires 6. Further, the electrodes 5 on the resin case 4 are led to external terminals 8 provided in the upper portion of the resin case, through wirings 7 composed of a metal such as Cu or the like and buried in the resin case 4.

Further, within the resin case 4, a plurality of support pillars 10 in each of which a pin (electrode) 9 is buried are provided in a state projecting from the bottom. By the plurality of support pillars 10, a controlling substrate 11 is supported, and, the pins 9 extend through predetermined patterns on the controlling substrate 11 and are soldered thereto, whereby the fixation and electrical connection of the controlling substrates 11 are effected. On the controlling substrate 11, various parts such as IC (integrated circuits) etc. are mounted, these parts being coupled to one another by wiring patterns (not shown) to form a control circuit; and, by this control circuit, signals for controlling the semiconductor chips 3 are generated. The signals generated by the control circuit constituted on the controlling substrate 11 are fed to the electrode pads on the semiconductor chips 3 via the wiring patterns (not shown) on the controlling substrate 11, the pins 9, the electrodes 5 and the bonding wires 6.

FIG. 2 is s plan view of the conventional power semiconductor module shown in FIG. 1, wherein the controlling substrate 11 is not shown. In this conventional case, the semiconductor chips mentioned above each constitute an IGBT (Insulated Gate Bipolar Transistor) formed in such a manner that, on the back surface of the chip, a collector electrode is formed, while on the front surface of the chip, a plurality of (four, in this embodiment) emitter electrode pads 4 and one gate electrode pad G are formed.

As shown, the gate electrode pad G on the front surface of each semiconductor chip 3 is connected to the electrode 5 on the resin case 4 through the bonding wire 6, and further, the electrode 5 is connected to the controlling substrate 11 through the pin 9.

In the case of the conventional power semiconductor module shown in FIG. 1 and FIG. 2, the circuit must be composed by connecting the bonding wires 6 to the electrodes 5 on the resin case, and, in case of feeding the respective semiconductor chips 3 with the control system signals generated on the controlling substrate 11, there must be provided a space for signal connection in the resin case 4 as in the case of a main signal. Due to this, there has arisen the problem that, when a plurality of semiconductor chips are used, the module as a whole is increased in size, thus resulting in an increase in the manufacturing costs.

As a result of the limitation on the connection with the resin case 4, a limitation is also placed on the disposition of the semiconductor chips 3; and thus, there has arisen the problem that the inductance component of the wirings is increased, thus resulting in the occurrence of the adverse effect that the reliability falls.

Here, as for the fact that the electrodes of the control signal system (gate control signal) are provided on the resin case disposed around the semiconductor chips, it is because the wire bonding connection steps can be continuously carried out as one step.

The reason why the module as a whole is large in size is that, as shown in FIG. 2, spaces for provision of the gate-relaying electrodes (electrodes 5) and the pins 9 need to be provided.

Further, as for the increase in the inductance component, the wiring length of the collector/emitter wirings plays a big role.

BRIEF SUMMARY OF THE INVENTION

Thus, it is the object of the present invention to provide a power semiconductor module which is small in size and has a low-inductance characteristic, the power semiconductor module being constituted in such a manner that the control electrodes on the semiconductor chips are directly connected, by means of bonding wires or the like, to the wiring patterns—other than the electrodes on the resin case—formed on a controlling substrate disposed above the semiconductor chips, whereby an ideal semiconductor chip arrangement is realized.

According to an embodiment of the present invention, there is provided a power semiconductor module, comprising a metal base, an insulated wiring substrate fixed on the metal base, at least one semiconductor chip which is fixed on the insulated wiring substrate and has control electrode on the upper surfaces thereof, a controlling substrate disposed above the at least one semiconductor chip and having a plurality of parts mounted thereon, the plurality of parts constituting a control circuit for controlling the at least one semiconductor chip, the controlling substrate having at least wiring pattern formed thereon, and at least one bonding wire which electrically connect the control electrode of the semiconductor chip and the wiring pattern on the controlling substrate to each other, respectively.

According to another embodiment of the present invention, there is provided a power semiconductor module, comprising a metal base, an insulated wiring substrate fixed on the metal base, at least one semiconductor chip which is fixed on the insulated wiring substrate and has control electrode on the upper surfaces thereof, a controlling substrate which is disposed above the semiconductor chip and has a plurality of parts mounted thereon, the plurality of parts constituting a control circuit for controlling the semiconductor chip, the controlling substrate having at least one wiring pattern formed thereon, and at least one wiring which has one end and the other end, the one end being connected by soldering to the control electrode for controlling the semiconductor chip, the other end being connected by soldering to the wiring pattern on the controlling substrate.

According to still another embodiment of the present invention, there is provided a power semiconductor module, comprising a metal base, an insulated wiring substrate fixed on the metal base, at least one semiconductor chip which is fixed on the insulating substrate and has a control electrode on the upper surface thereof, a controlling substrate which is disposed above the semiconductor chip and has a plurality of parts mounted thereon, the plurality of parts constituting a control circuit for controlling the semiconductor chip, the controlling substrate having at least one wiring pattern formed thereon, and a pressure contacting mechanism which is provided between the control electrode of the semiconductor chip and the wiring pattern on the controlling substrate to electrically connect the control electrode and the wiring pattern to each other.

According to still another embodiment of the present invention, there is provided a power semiconductor module, comprising a metal base, an insulated wiring substrate having an insulating substrate which has first and second surfaces opposed to each other and first and second conductive layers formed on the first and second surfaces of the insulating substrate, the first conductive layer being fixed by soldering onto the metal base, at least one IGBT chip which has first and second surfaces opposed to each other, a collector electrode being formed on the first surface, a gate electrode and emitter electrodes being formed on the second surface in a state electrically separated from each other, the collector electrodes being fixed by soldering onto the second conducive layers of the insulated wiring substrate, a controlling substrate which is disposed above the IGBT chip and has a plurality of parts mounted thereon, the plurality of parts constituting a control circuit for controlling the IGBT chip, the controlling substrate having at least one wiring pattern formed thereon, and at least one bonding wire which electrically connect the gate electrode of the IGBT chip and the wiring pattern on the controlling substrate to each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Embodiments of the present invention will now be described by reference to the drawings.

Figure 3:
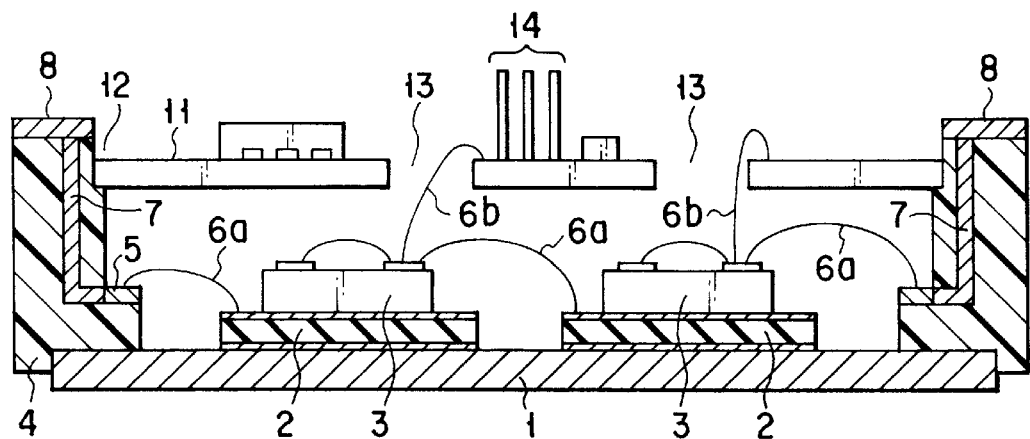
FIG. 3 is a sectional view of the power semiconductor module according to a first embodiment of the present invention.

FIG. 3 is a sectional view of the power semiconductor module according to a first embodiment of the present invention. In the description to follow, the constituent portions which correspond to those of the conventional power semiconductor module are referenced by the same reference numerals.

Numeral 1 denotes a metal base, and numeral 2 denotes insulated wiring substrates. The insulated wiring substrates 2 are each formed in such a manner that, on the front and back surfaces of a ceramics substrate, a conductive layer composed of a metal such as, e.g. Cu is formed. The insulated wiring substrates 2 are each fixed onto the metal base 1 by soldering thereto the conductive layer formed on the back surface thereof to the metal base 1. Numeral 3 denotes semiconductor chips; and, over the whole back surface of each of the semiconductor chips 3, an electrode is formed, while on the front surface thereof, a plurality of electrode pads are formed in a state electrically separated from one another. The semiconductor chips 3 are each fixed onto the insulating substrate 2 in such a manner that the electrode formed over the whole rear surface thereof is soldered onto the conductive layer formed on the front surface of each of the insulated wiring substrates 2.

The metal base 1 is fixed to a resin case 4. The electrical connection between specific electrode pads on the front surfaces of the semiconductor chips 3, the electrical connection between specific electrode pads on the front surfaces of the semiconductor chips 3 and the conductive layers on the front surfaces of the insulated wiring layers 2, the electrical connection between the conductive layers on the front surfaces of the insulated wiring substrates 2 and the electrodes 5 provided on the resin case 4, and the electrical connection between specific electrode pads on the front surfaces of the semiconductor chips 3 and the electrodes 5 provided on the resin case 4 is made through bonding wires 6a. Further, the electrodes 5 on the resin case 4 are led to external terminals 8 provided in the upper portion of the resin case 4, via wirings 7 composed of a metal such as Cu or the like and buried in the resin case 4.

Further, on the inner side of the upper portion of the resin case 4, stepped portions 12 are provided, and, on these stepped portions 12, a controlling substrate 11 is disposed and fixed by the use of an adhesive or the like.

On the controlling substrate 11, various parts such as an IC (integrated circuit) etc. are mounted as in the conventional case; and these parts are connected to each other by wiring patterns (not shown) to constitute a control circuit. By this control circuit, signals for controlling the semiconductor chips 3 are produced.

Further, in the controlling substrate 11, a plurality of openings 13 are formed, so that the signals produced on the controlling substrate 11 are fed to the semiconductor chips 3 via bonding wires 6b extending through the openings 13 so as to directly connect the wiring patterns (not shown) on the controlling substrate 11 and specific electrode pads on the semiconductor chips 3 to each other.

Further, on the controlling substrate 11, a plurality of electrodes 14 for receiving signals from outside are provided in a projecting state.

Figure 4:
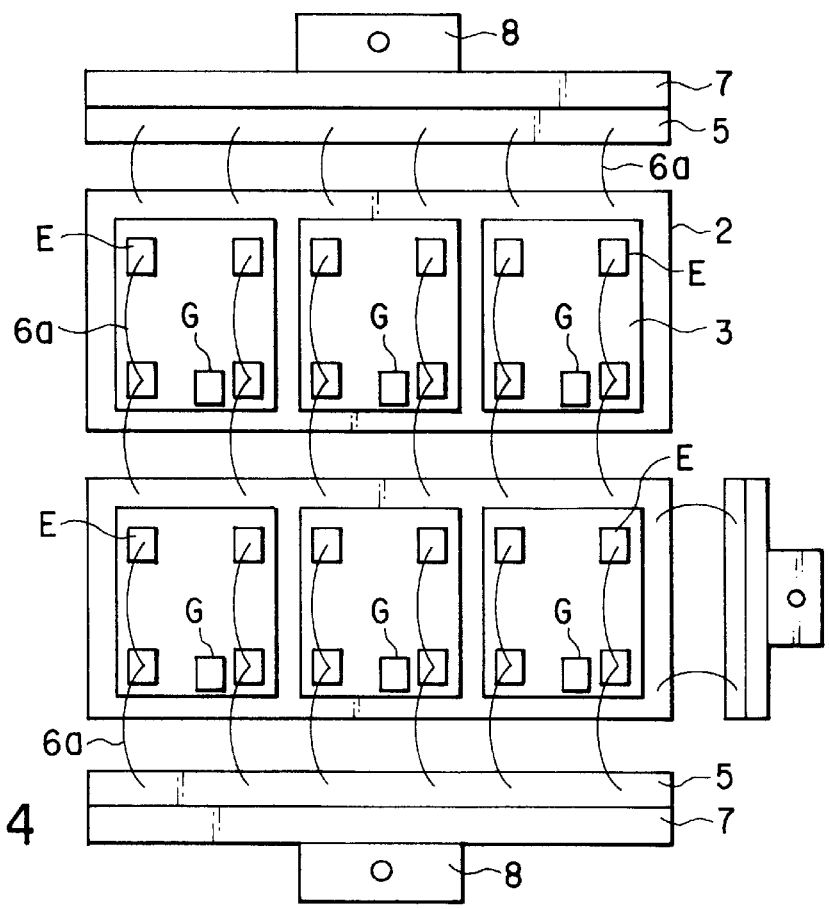
FIG. 4 is a plan view of the power semiconductor module shown in FIG. 3.

FIG. 4 is a plan view of the power semiconductor module shown in FIG. 3, wherein the controlling substrate 11 is not shown. In this embodiment, the semiconductor chips 3 each constitute an IGBT formed in such a manner that a collector electrode is formed as an electrode provided over the whole rear surface of the chip, and a plurality of (four, in this embodiment) emitter electrode pads E and one gate electrode pad G are formed on the front surface of the chip.

As shown, the emitter electrode pads E on the front surfaces of the respective semiconductor chips 3 are finally connected to the external terminals 8 on the resin case 4 through the bonding wires 6a. On the other hand, the gate electrode pads G are directly connected, by the bonding wires 6b, to predetermined wiring patterns (not shown in FIG. 4) on the controlling substrate 11.

Figure 5:
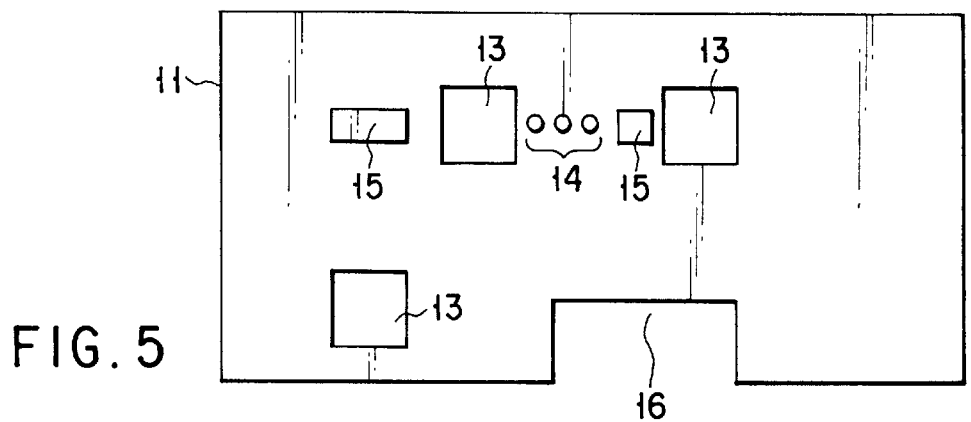
FIG. 5 is a plan view of the controlling substrate used in the power semiconductor module shown in FIG. 3.
Figure 6:
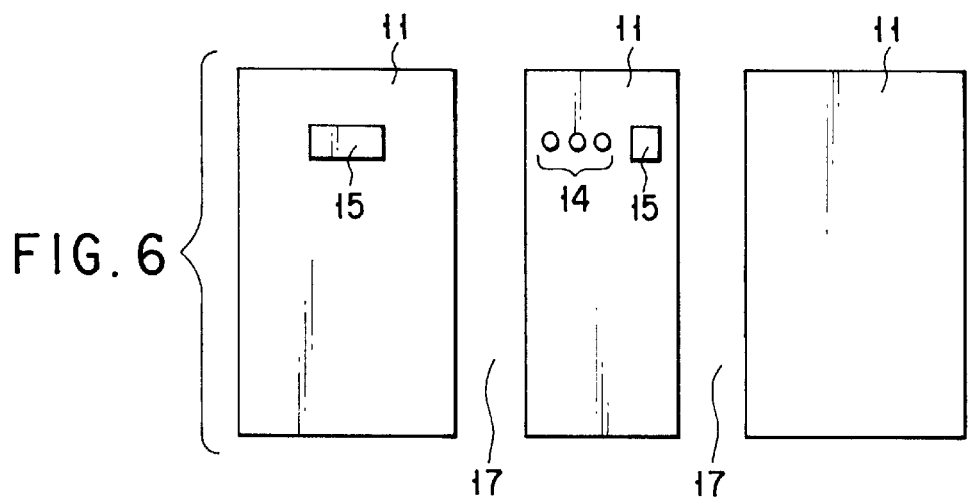
FIG. 6 is a plan view of a controlling substrate different from the controlling substrate shown in FIG. 5.

FIG. 5 and FIG. 6 are plan views of different embodiments of the controlling substrate 11. The controlling substrate 11 shown in FIG. 5 is what is used in the embodiment shown in FIG. 3; and, in the controlling substrate 11, a plurality of electrodes 14 are formed besides the openings 13, and the plurality of parts 15 are mounted. Further, numeral 16 denotes a cut-away recess formed in one side portion of the controlling substrate 11. The bonding wires 6b may be disposed so as to extend through this cut-away recess 16 to electrically connect the wiring patterns on the controlling substrate 11 to the gate electrode pads G on the front surfaces of the semiconductor chips 3.

The above-mentioned stepped portions 12 provided on the resin case 4 may be provided on all of the four sides of the resin case 4 in case the plane shape of the resin case 4 is square as shown in FIG. 5 or in some (for instance, two opposed sides) of the four sides.

The controlling substrate 11 shown in FIG. 6 is constructed in such a manner that, in order to allow the passage there through of the bonding wires 6b, the controlling substrate 11 itself is divided into a plurality of portions (three portions, in this embodiment) in place of providing the openings 13. In this case, the bonding wires 6b are made to extend through gaps 17 between the substrate portions.

Figure 7:
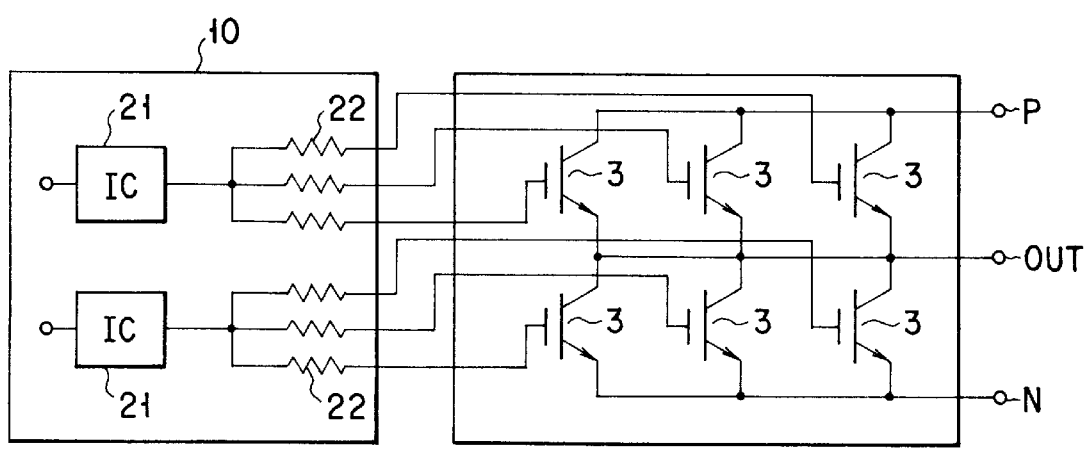
FIG. 7 is an equivalent circuit diagram of the power semiconductor module shown in FIG. 3.

FIG. 7 is an equivalent circuit diagram of the power semiconductor module according to the above-mentioned embodiment. In the controlling substrate 11, a plurality of (two, in this embodiment) ICs (integrated circuits) 21 and three resistors 22, one end of each of which is connected to the output of the respective IC, are provided as the parts 15. The other ends of the resistors 22 are connected to the gate electrodes of the semiconductor chips 3 (six IGBTs in this embodiment), respectively. The six semiconductor chips 3 are divided into two sets each consisting of three semiconductor chips 3. The collector electrodes of the three semiconductor chips in one set are connected to an external terminal P to which a positive power supply voltage is supplied, while the emitter electrodes thereof are connected commonly to an output external terminal OUT. The collector electrodes of the three semiconductor chips 3 in the other set are connected commonly to the external terminal OUT, while the emitter electrodes thereof are connected commonly to an external terminal N to which the earth potential is supplied.

Figure 1:
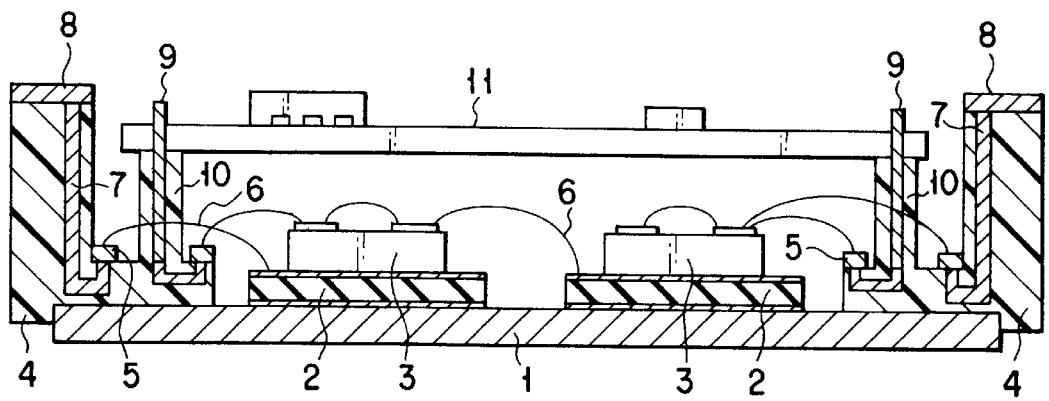
FIG. 1 is a sectional view of a conventional power semiconductor module.
Figure 2:
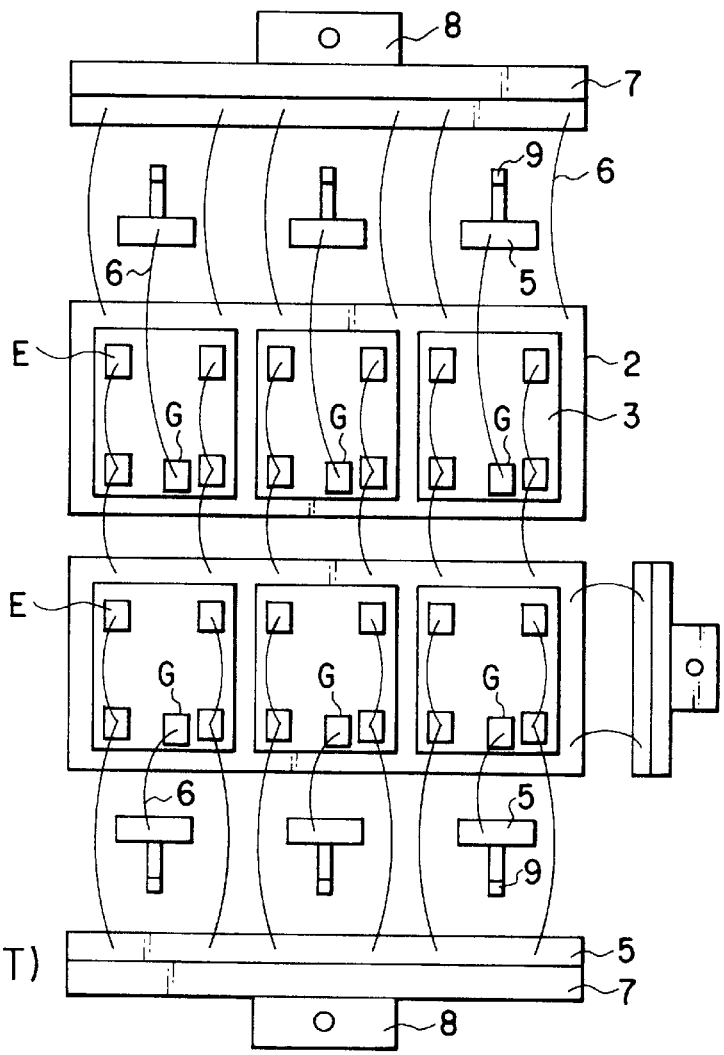
FIG. 2 is a plan view of the conventional power semiconductor module shown in FIG. 1.

With this constitution, the electrodes 5 (the relating electrodes 5) on the resin case 4 which are used in connecting gate electrode pads G as shown in FIG. 2 are disused, so that it becomes possible to dispose the semiconductor chips in an ideal arrangement; and thus, the apparatus as a whole can be miniaturized. Further, the external terminals 8 which are connected to the collector electrodes C and the emitter electrode pads E of the semiconductor chips 3 can be disposed at positions closer to the semiconductor chips 3, so that the bonding wires 6a for connection of the collectors and emitters can be reduced in length, whereby a reduction in the inductance of the wirings can be realized.

Further, in place of the controlling substrate 11, a metal wiring body may be used. In case the control circuit is mounted by the use of the metal wiring body, the metal wiring body itself serves as wirings, and therefore, it is necessary to work the metal wiring body into a predetermined shape. In this case, the respective parts constituting the control circuit are provided outside the module in some cases; in such a case, the controlling substrate is used only as wirings.

Further, finally, the open portion, above the controlling substrate, of the resin case is covered with a cover plate, whereby the module is completed. In this case, the electrodes 14 are placed in a state projecting out through the cover plate.

Figure 8:
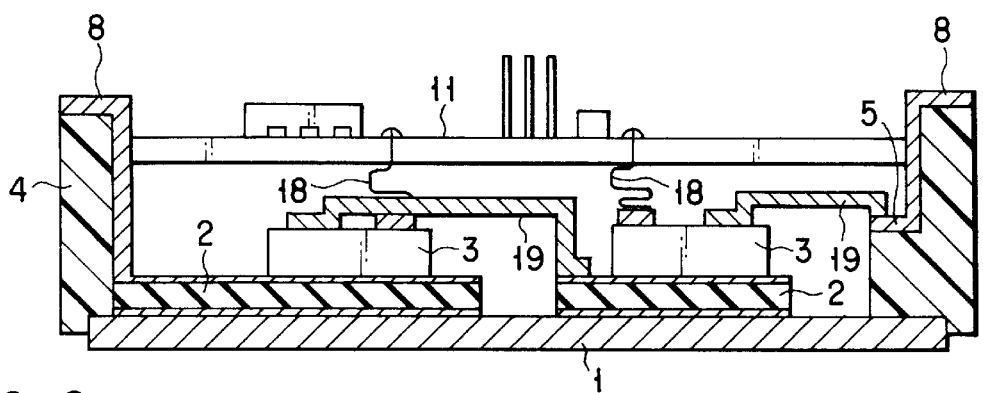
FIG. 8 is a sectional view of the power semiconductor module according to another embodiment of the present invention.

FIG. 8 is a sectional view of the power semiconductor module according to another embodiment of the present invention. In the case of this embodiment, the connection between specific electrodes (the gate electrode pads G in FIG. 4) on the semiconductor chips 3 and the wiring patterns on the controlling substrate 11 is made by the soldering of wirings 18. Further, the connection between specific electrodes (the emitter electrode pads E shown in FIG. 4) on the front surfaces of semiconductor chips 3 and the electrically conductive layer on the front surface of the insulated wiring substrate 2 onto which the different semiconductor chips 3 are fixed, and the connection between specific electrodes (the emitter electrode pads E shown in FIG. 4) on the front surfaces of the semiconductor chips 3 and the electrodes 5 on the resin case 4 are made by the soldering of metal wiring plates 19. By improving the disposition of the electrodes on the surfaces of the semiconductor chips 3, such ways of connection becomes possible.

According to this embodiment, the electrical connection between the conductive layer on one insulating wiring substrate 2 and the external terminals 8 is realized by forming the external terminals 8 integrally with the conductive layer on the front surface of the insulating wiring substrate 2, without using bonding wires as according to the conventional technique.

Figure 9:
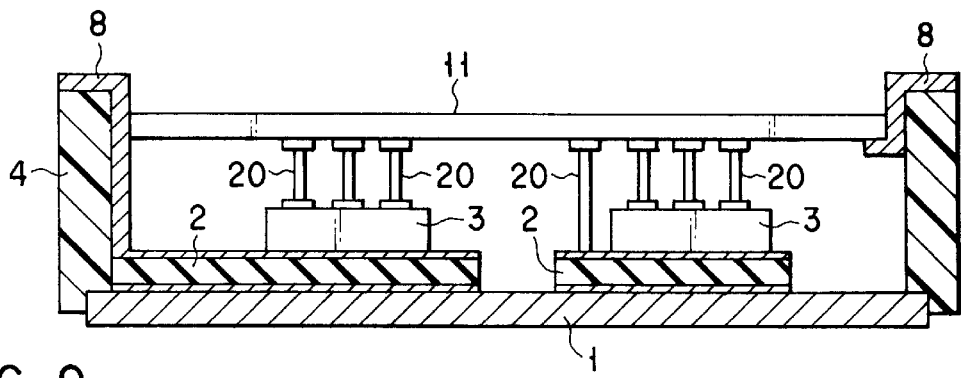
FIG. 9 is a sectional view of the power semiconductor module according to still another embodiment of the present invention.

FIG. 9 is a sectional view of the power semiconductor module according to still another embodiment of the present invention. In the case of this embodiment, the electrical connection between the wiring patterns on the controlling substrate 11 and the respective electrode pads on the front surfaces of the semiconductor chips 3 as well as the conductive layer on the front surface of one insulated wiring substrate 2 is effected by the use of a pressure contact mechanism. In this pressure contact mechanism, pressure-contacting pins 20 are used.

Further, in the respective embodiments mentioned above, the electrical connection between the conductive layer on the front surface of the insulating wiring substrate 2 which is connected to the collector electrodes on the semiconductor chips and the external terminals 8 can alternatively be effected by means of welding.

Figure 10:
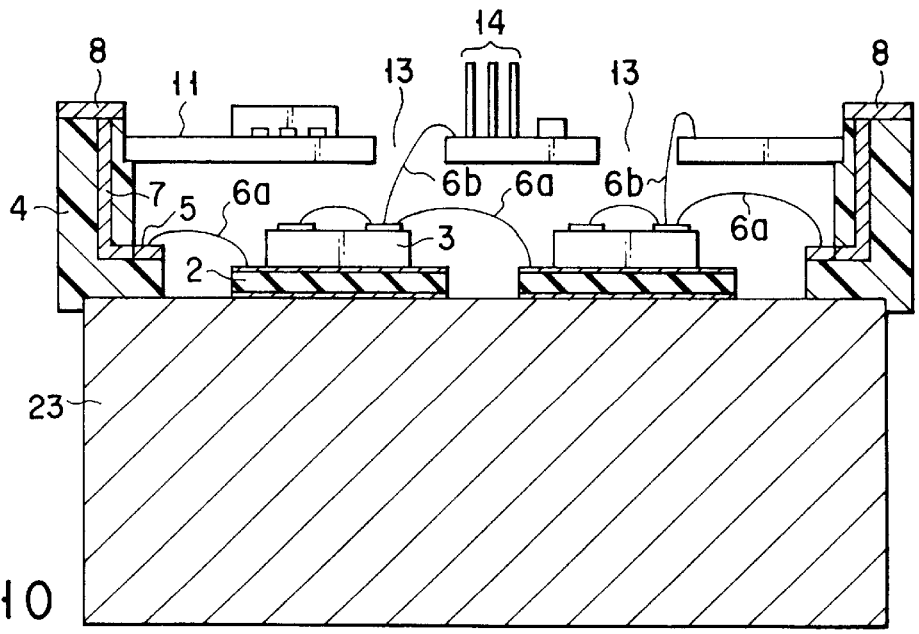
FIG. 10 is a sectional view of the power semiconductor module according to still another embodiment of the present invention.

FIG. 10 is a sectional view of the power semiconductor module according to still another embodiment of the present invention. This embodiment is constituted in such a manner that, as the metal base 1 shown in FIG. 3, a plate-shaped metal base is not used, but a metal radiation fin 23 based on various cooling systems such as the self-cooling, water-cooling, air-cooling, etc. is used. Also in the cases of the embodiments shown in FIG. 8 and FIG. 9, the radiation fin 23 can be used as the metal base 1.

It is a matter of course that the present invention is not limited only to the above-mentioned embodiments but can be variously modified. For instance, the embodiment shown in FIG. 3 has been described with reference to the case where, in order to fix the controlling substrate 11 to the resin case 4, the stepped portions 12 are provided on the inner side of the upper portion of the resin case 4, and the controlling substrate 11 is disposed on the stepped portions 12 and fixed by the use of an adhesive or the like, but the embodiment can be modified in such a manner that, in addition to the provision of the stepped portions, stripe-shaped support portions are formed integrally with the resin case 4, and, on the stripe-shaped support portions, the controlling substrate 11 is placed and fixed, in which case care should be taken to ensure that the openings 13 in the controlling substrate 11 are disposed so as not to overlap the stripe-shaped support portions.

As described above, according to the present invention, there can be provided a power semiconductor module which has an ideal semiconductor chip arrangement, is small in size and, in addition, has a low-inductance characteristic.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A power semiconductor module, comprising:
   a metal base;
   an insulated wiring substrate fixed on the metal base;
   at least one semiconductor chip which is fixed on the insulated wiring substrate and has control electrode on the upper surfaces thereof;
   a controlling substrate disposed above the at least one semiconductor chip and having a plurality of parts mounted thereon, the plurality of parts constituting a control circuit for controlling the at least one semiconductor chip, the controlling substrate having at least one wiring pattern formed thereon; and
   at least one bonding wire which electrically connect the control electrode of the at least one semiconductor chip and the at least one wiring pattern on the controlling substrate to each other.

2. A module according to claim 1, wherein the controlling substrate has opening through which the at least one bonding wire pass.

3. The module according to claim 1, wherein the controlling substrate has a cut-away recess through which the at least one bonding wire pass.

4. The module according to claim 1, wherein the controlling substrate is divided into a plurality of portions, whereby gaps through which the at least one bonding wire pass exist between the respective controlling substrate portions.

5. The module according to claim 1, wherein the insulated wiring substrate comprising:
   an insulating substrate which has first and second surfaces opposed to each other; and
   conductive layers which are formed on the first and second surfaces of the insulating substrate, respectively.

6. The module according to claim 5, wherein the at least one semiconductor chip is fixed by soldering to the conductive layer formed on the first or second surface of the insulated wiring substrate.

7. The module according to claim 1, wherein the metal base is a radiation fin.

8. A power semiconductor module, comprising:
   a metal base;
   an insulated wiring substrate fixed on the metal base;
   at least one semiconductor chip which is fixed on the insulated wiring substrate and has control electrode on the upper surfaces thereof;
   a controlling substrate which is disposed above the at least one semiconductor chip and has a plurality of parts mounted thereon, the plurality of parts constituting a control circuit for controlling the at least one semiconductor chip, the controlling substrate having at least one wiring pattern formed thereon; and
   at least one wiring which has one end and the other end, the one end being connected by soldering to the control electrode for controlling the at least one semiconductor chip, the other end being connected by soldering to the wiring pattern on the controlling substrate.

9. The module according to claim 8, wherein the insulated wiring substrate comprise
   an insulating substrate which has first and second surfaces opposed to each other, and
   conductive layers formed on the first and second surfaces of the insulating substrate, respectively.

10. The module according to claim 8, wherein the at least one semiconductor chip is fixed by soldering to the conductive layer formed on the first or second surface of the insulated wiring substrate.

11. The module according to claim 8, wherein the metal base is a radiation fin.

12. A power semiconductor module, comprising:
   a metal base;
   an insulated wiring substrate fixed on the metal base;
   at least one semiconductor chip which is fixed on the insulating substrate and has a control electrode on the upper surface thereof;
   a controlling substrate which is disposed above the at least one semiconductor chip and has a plurality of parts mounted thereon, the plurality of parts constituting a control circuit for controlling the at least one semiconductor chips, the controlling substrate having at least one wiring pattern formed thereon; and
   a pressure contacting mechanism which is provided between the control electrode of the at least one semiconductor chip and the wiring pattern on the controlling substrate to electrically connect the control electrode and at least one wiring pattern to each other.

13. The module according to claim 12, wherein the pressure contacting mechanism includes pressure-contacting metal pin provided between the control electrode and the at least one wiring pattern on the controlling substrate.

14. The module according to claim 12, wherein the insulated wiring substrate comprising an insulating substrate which has first and second surfaces opposed to each other, and conductive layers formed on the first and second surfaces of the insulating substrate, respectively.

15. The module according to claim 12, wherein the metal base is a radiation fin.

16. The module according to claim 14, wherein the at least one semiconductor chip is fixed by soldering onto the conductive layer formed on the first or second surface of the insulated wiring substrate.

17. A power semiconductor module, comprising:

a metal base;

an insulated wiring substrate having an insulating substrate which has first and second surfaces opposed to each other and first and second conductive layers formed on the first and second surfaces of the insulating substrate, the first conductive layer being fixed by soldering onto the metal base;

at least one IGBT chip which has first and second surfaces opposed to each other, a collector electrode being formed on the first surface, a gate electrode and emitter electrodes being formed on the second surface in a state electrically separated from each other, the collector electrodes being fixed by soldering onto the second conducive layer of the insulated wiring substrate;

a controlling substrate which is disposed above at least one IGBT chip and has a plurality of parts mounted thereon, the plurality of parts constituting a control circuit for controlling the IGBT chip, the controlling substrate having at least one wiring pattern formed thereon; and at least one bonding wire which electrically connect the gate electrode of the at least one IGBT chip and at least one wiring pattern on the controlling substrate to each other.

18. The module according to claim 17, wherein the controlling substrate has opening through which the at least one bonding wire pass.

19. The module according to claim 17, wherein the controlling substrate has a cut-away recess through which the at least one bonding wire pass.

20. The module according to claim 17, wherein the controlling substrate is divided into a plurality of portions, whereby at least one gap through which the at least one bonding wire pass exist between the controlling substrate portions.

21. The module according to claim 17, wherein the metal base is a radiation fin.

* * * * *